United States Patent
Zhang et al.

(10) Patent No.: US 9,108,524 B2
(45) Date of Patent: Aug. 18, 2015

(54) BATTERY SOC ESTIMATION WITH AUTOMATIC CORRECTION

(71) Applicant: GM GLOBAL TECHNOLOGY OPERATIONS LLC, Dearborn, MI (US)

(72) Inventors: Yilu Zhang, Northville, MI (US); Xinyu Du, Windsor (CA); Mutasim A. Salman, Rochester Hills, MI (US); Shuo Huang, Warren, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 143 days.

(21) Appl. No.: 14/059,751

(22) Filed: Oct. 22, 2013

(65) Prior Publication Data

US 2015/0112527 A1    Apr. 23, 2015

(51) Int. Cl.
*B60L 11/18* (2006.01)
*B60W 20/00* (2006.01)

(52) U.S. Cl.
CPC ............ *B60L 11/1861* (2013.01); *B60W 20/00* (2013.01)

(58) Field of Classification Search
None
See application file for complete search history.

(56) References Cited

U.S. PATENT DOCUMENTS

| | | | | |
|---|---|---|---|---|
| 4,958,127 | A * | 9/1990 | Williams et al. | 324/426 |
| 8,548,761 | B2 * | 10/2013 | Lim et al. | 702/63 |
| 2007/0145948 | A1 * | 6/2007 | Lim et al. | 320/132 |
| 2008/0053715 | A1 * | 3/2008 | Suzuki et al. | 180/2.1 |
| 2008/0054850 | A1 * | 3/2008 | Tae et al. | 320/136 |
| 2008/0150457 | A1 * | 6/2008 | Salman et al. | 318/139 |
| 2009/0157335 | A1 * | 6/2009 | Zhang et al. | 702/63 |
| 2010/0318252 | A1 * | 12/2010 | Izumi | 701/22 |
| 2012/0091969 | A1 * | 4/2012 | Izumi | 320/148 |
| 2014/0021959 | A1 * | 1/2014 | Maluf et al. | 324/430 |
| 2014/0172333 | A1 * | 6/2014 | Gopalakrishnan et al. | 702/63 |
| 2014/0210418 | A1 * | 7/2014 | Wang et al. | 320/134 |
| 2014/0244225 | A1 * | 8/2014 | Balasingam et al. | 703/2 |
| 2014/0350877 | A1 * | 11/2014 | Chow et al. | 702/63 |

\* cited by examiner

*Primary Examiner* — Mussa A Shaawat

(57) ABSTRACT

An embodiment contemplates a method of determining a state-of-charge of a battery for a vehicle. (a) An OCV is measured for a current vehicle ignition startup after ignition off for at least eight hours. (b) An $SOC_{OCV}$ is determined for the current vehicle ignition startup. (c) An $SOC_{OCV\_est}$ is determined for a current vehicle ignition startup. (d) A determination is made whether the difference in the $SOC_{OCV}$ for the current startup and the $SOC_{OCV_{est}}$ for the current startup is less than a predefined error bound using. Steps (a)-(d) is performed in response to the difference being greater than the predefined error; otherwise, determining an ignition-off current for the current vehicle ignition startup as a function of the $SOC_{OCV}$ of the current vehicle ignition startup and previous vehicle ignition startup, and a SOC based on current integration over time. Determining an $SOC_{est}$ of the current vehicle ignition startup using the processor.

18 Claims, 4 Drawing Sheets

BATTERY SOC ESTIMATION WITH AUTOMATIC CORRECTION

BACKGROUND OF INVENTION

An embodiment relates generally to external device integration within a vehicle.

Determining a state-of-charge (SOC) for a battery can be performed utilizing various techniques utilizing coulomb counting or parameter estimations techniques. Coulomb counting involves the use of one measurement (i.e., battery current) to estimate the battery state-of-charge. The accuracy of the battery current is critical to determining a state-of-charge. If there is measurement error, such as the current sensor not accurate integration error accumulates quickly. Furthermore, the coulomb counting is not carried out during the vehicle ignition off in order to save battery energy, which may bring additional SOC estimation error. Most vehicles utilize low end current and voltage sensors which do not provide accurate results. Therefore, many systems utilize high cost current sensors to monitor SOC all the time to overcome this deficiency.

SUMMARY OF INVENTION

An advantage of an embodiment is a determination of the state-of-charge (SOC) of a battery utilizing an estimation technique without the use of expensive and high accuracy sensors. The estimation technique utilizes a previous SOC estimation, a present SOC estimation, and a current integration estimation for determining an estimated SOC. The current integration utilizes an ignition-on current integration and an ignition-off current integration determination. The ignition-off integration is determined as a function of a previous open circuit voltage SOC estimation, a present open circuit voltage SOC estimation, and a current integration estimation where the previous and present open circuit voltages are based on open circuit voltage measurements after at least an 8 hour ignition-off period. A comparison is made between the present open circuit voltage SOC measurement and the previous open circuit voltage SOC measurement to determine whether the data from either SOC is skewed by the battery not being at equilibrium. If so, then a next open circuit voltage SOC will be obtained at a next ignition off for generating a next open circuit voltage SOC which may be used to determine the ignition-off current.

An embodiment contemplates a method of determining a state-of-charge of a battery for a vehicle. The vehicle is in a charging state when the engine is operating and a non-charging state when the engine is not operating, the method comprising the steps of: (a) measuring an OCV for a current vehicle ignition startup using a voltmeter, wherein the current vehicle ignition start-up is performed after the vehicle is in the non-charging state for at least eight hours; (b) determining an $SOC_{OCV}$ for the current vehicle ignition startup using the processor; (c) determining an $SOC_{OCV\_est}$ for a current vehicle ignition startup using the processor; (d) determining whether the difference in the $SOC_{OCV}$ for the current vehicle ignition startup and the $SOC_{OCV_{est}}$ for the current vehicle ignition startup is less than a predefined error bound using the processor; (e) performing steps (a)-(d) in response to the difference being greater than the predefined error; otherwise, proceeding to step (f); (f) determining an ignition-off current for the current vehicle ignition startup as a function of the $SOC_{OCV}$ of the current vehicle ignition startup, an $SOC_{OCV}$ of a previous vehicle ignition startup, and a state-of-charge based on current integration over time using the processor technique; and (g) determining an $SOC_{est}$ of the current vehicle ignition startup using the processor.

DETAILED DESCRIPTION

Figure 1:
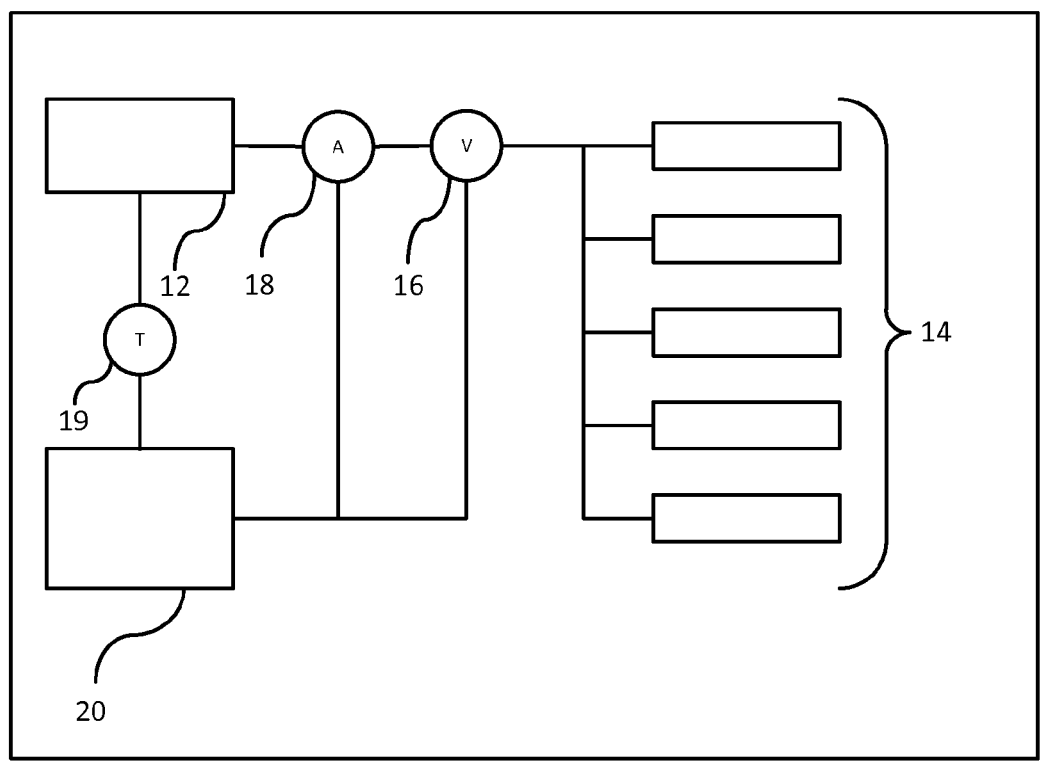
FIG. 1 is a block diagram of a state-of-charge estimation system.

FIG. 1 illustrates a block diagram of an embodiment of a vehicle 10 incorporating a state-of-charge (SOC) estimation system. The vehicle 10 includes a battery 12 for starting the vehicle. The battery 12 is a lead-acid battery. The battery 12 is typically made up of cells that contain electrodes (cathode and anode) of lead (Pb) and lead oxide ($PbO_2$) in an electrolyte of sulfuric acid. A chemical reaction takes place to store energy within the battery. The concept is to convert lead sulphate that forms on the plates of a discharged battery into lead dioxide which forms the plates of a charged battery.

The vehicle battery 12 is electrically coupled to a plurality of devices 14 which utilize the battery as a power source. The vehicle 10 may further include a voltage meter 16, a current sensor 18, a temperature sensor 19, and a control module 20.

The plurality of devices 14 include, but are not limited to, power outlets adapted to an external device, accessories, components, subsystems, and systems of a vehicle. The current sensor 16 is used to monitor the current leaving the vehicle battery 12. The voltmeter 18 measures a voltage so that an open circuit voltage (OCV) may be determined. The temperature sensor 19 senses the temperature of the battery and can be used as a factor in determining the state-of-charge of the battery. A control module 20, or similar module, obtains, derives, monitors, and/or processes a set of parameters associated with the vehicle battery 12. These parameters may include, without limitation, current, voltage, state-of-charge (SOC), battery capacity, battery internal resistances, battery internal reactance, battery temperature, and power output of the vehicle battery. The control module 20 includes a processor for executing for executing a vehicle state-of-charge (SOC) estimation technique.

The control module 20 utilizes the OCV of the battery for determining the SOC. The SOC may be derived by determining the OCV and then applying OCV mapping or current integration may be applied. To accurately determine the SOC, the OCV may be accurately measured only after the OCV equilibrium is obtained, which occurs a predetermined time after battery charging has been discontinued (i.e., either by an ignition off operation or other charging device). Typically the predetermined time to obtain OCV equilibrium includes 24 hours after charging the battery is discontinued. That is, an open-circuit voltage measurement is accurate only when the battery voltage is under the equilibrium conditions.

Electrical charges on the surface of the battery's plates cause false voltmeter readings. When a battery is charged, the surface of the plates may have a higher charge than the inner portions of the plates. After a period of time after charging has been discontinued, the surface charge on the surface of the plates will become slightly discharged as a result of the charged energy penetrating deeper into the plates. Therefore, the surface charge, if not dissipated to the inner portion of the plates, may make a weak battery appear good. As a result, to obtain an accurate OCV measurement that can be used to determine the SOC, the vehicle typically must be at rest for a long duration of time >8 hours.

Furthermore, for lead acid batteries, the battery transforms the chemical energy into electrical energy as the result of a chemical reaction between the electrolyte solution and the lead of the plates. During the energy conversion and discharge of electrical energy from the battery, the acid reacts with the lead of the plates to build up a sulfate composition. As a load is connected across the terminals, a current flow of electrons is produced to equalize the difference in the charges on the plates. Excess electrons flow from the negative plate to the positive plate. During current flow, the plates can be measured by the poles of the battery to determine the voltage. Stratification of the battery plates occurs if the electrolyte solution is stratified. Since acid is denser than water, the acid build up and layering is greater on bottom of the battery solution than in comparison to the bottom of the battery. The high acid concentration in the lower portion of the battery artificially raises an open circuit voltage and the battery voltage appears to be fully charged and operable, but this is not the case. The amount of current available that the battery can deliver for a defined duration of time while maintaining a terminal-to-terminal voltage when significant stratification is present is very low as opposed a newly produced battery. As a result a false SOC reading may be detected while stratification is present within the battery.

Typical routines assume that open circuit voltage is measured when the battery is in an equilibrium state (i.e., no surface charge and no acid stratification). These typical routines will use the following formula to determine the running state-of-charge which can be represented follows:

$$S_{OC} = f(V_{OC}(0), T) + \frac{1}{C_{norm}} \int \rho \cdot I \cdot dt$$

where $f(V_{OC}(0),T)$ is the present startup $$SOC \text{ and } \frac{1}{C_{norm}} \int \rho \cdot I \cdot dt$$

is the state of charge that is determined by coulomb counting while the charging is occurring. These routines measure the open circuit voltage (OCV) after a long ignition key off such as 8 or 16 hours; however, depending on the charging history, a battery may not reach the equilibrium stage at the $8^{th}$ or $16^{th}$ hour. In addition, if the current sensor is not accurate, then integration error accumulates over time with respect to the coulomb counting. Moreover, current measurements during the ignition off are sparse and inaccurate. The following procedure overcomes deficiencies of low cost current sensors, surface charge and acid stratification.

Figure 2:
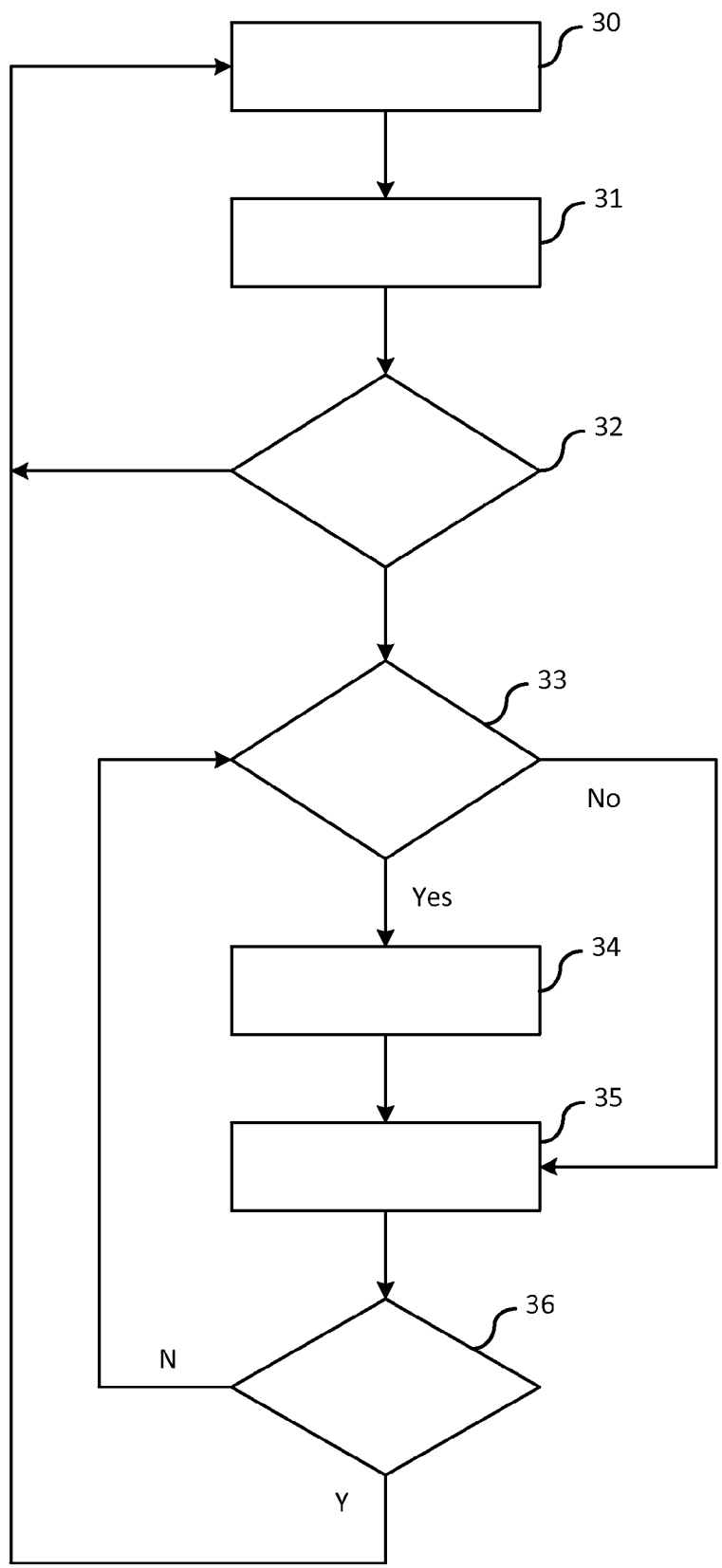
FIG. 2 is a flowchart for estimating the state-of-charge (SOC) over time.
Figure 3:
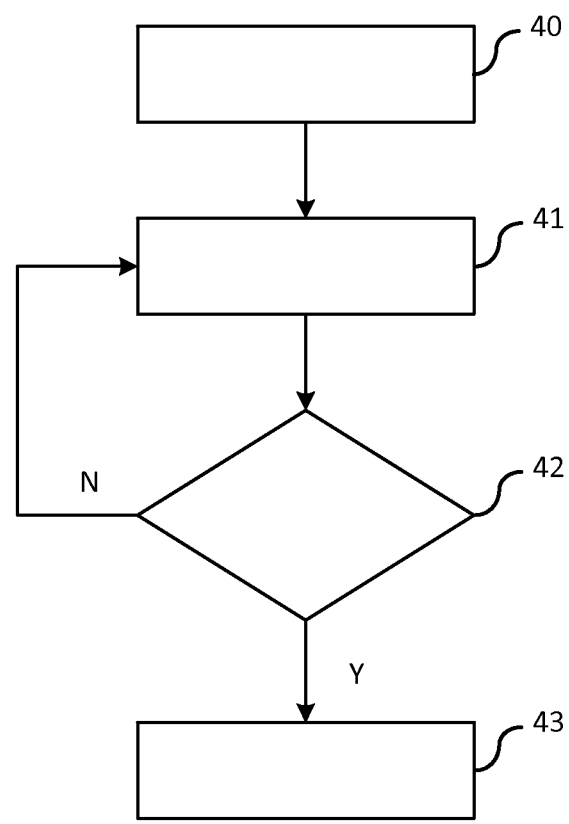
FIG. 3 is a flowchart for identifying a first state-of-charge and a second state-of-charge.
Figure 4:
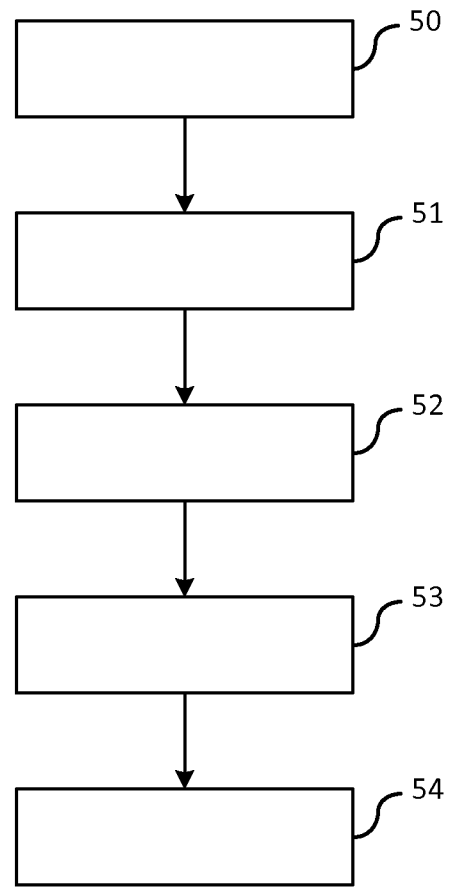
FIG. 4 is a flowchart for identifying an ignition-off current.

FIG. 2 illustrates a flowchart of a general overview for estimating the state-of-charge (SOC) over time. In step 30, data for determining the SOC is obtained. In step 31, algorithm 1, shown in FIG. 3, is executed for identifying $SOC_0$ and $SOC_1$. $SOC_0$ is a state-of-charge at a first instance of time for a respective ignition cycle, and $SOC_1$ is a state-of-charge at a later instance of time for later ignition cycle. The initial objective is find an $SOC_0$ and $SOC_1$ that are within a predetermined error of one another. If a respective set of $SOC_0$ and $SOC_1$ are not within a predetermined error, then the likelihood that $SOC_1$ is not an accurate determination based on equilibrium of the battery and a next ignitions cycle is analyzed for identifying a next $SOC_1$.

In step 32, a determination is made as to whether $SOC_0$ and $SOC_1$ are in agreement with one another. That is, a determination is made whether the respective SOC values are offset by a predetermined amount, and if so, would indicate that a respective set of values are invalid and that a calculation for an estimated state-of-charge would also be incorrect. If the determination is made that $SOC_0$ and $SOC_1$ are not in agreement with one another, then a return is made to step 30 for determining a state-of-charge at a next ignition cycle. If the determination is made in step 32 that the $SOC_0$ and $SOC_1$ are in agreement with one another, then the routine proceeds to step 33.

In step 33, a determination is made as to whether the ignition off time >8 hours and whether the open circuit voltage $SOC_{OCV}$ is within the error bound. The $SOC_{OCV}$ is the state-of-charge value calculated as a function of the open circuit voltage (OCV) and the battery estimated temperature. The OCV is the battery voltage which is measured before the current ignition cycle (k) but after at least eight hours since the last charging state. After at least eight hours, the battery current is very low (<20 ma), so the battery voltage is the OCV. Therefore, the $SOC_{OCV}$ may be determined from the determined OCV. If the determination is that made that either one of the conditions are not satisfied, then the routine proceeds to step 35; otherwise the routine proceeds to step 34.

In step 34, algorithm 2, as described in detail later, is utilized for updating the ignition time off current $I_{ign\_off}$. After $I_{ign\_off}$ is updated, the routine proceeds to step 35.

In step 35, the state-of-charge estimation $SOC_{est}$ is updated utilizing the following equation:

$$SOC_{(est)}(k) = SOC_{est}(k-1) + \frac{1}{C_{norm}} \int \rho \cdot I_{on} \cdot dt + \frac{1}{C_{norm}} I_{off} \cdot \Delta t_{off}(k-1)$$

where (k) is the number of ignition cycles with at least an eight hour ignition off time before a next cycle is initiated, $SOC_{est}(k-1)$ is the state-of-charge at the k−1 ignition start, $C_{norm}$ is the battery normal capacity, $\rho$ is the charge efficiency, $I_{on}$ is the ignition on-current, $I_{off}$ is the ignition off-current, and $\Delta t_{off}$ is the ignition off time between (k−1) ignition-on cycle and (k) ignition-on cycle.

In step 36, a determination is made as to whether $SOC_{est}$ confidence is high (e.g., the length of time since the last $SOC_0$ and $SOC_1$ have been used). If the confidence is high, then $SOC_0$ may be utilized again for updating $I_{ign\_off}$. The routine then returns to step 33. If the confidence is low, then the routine proceeds to step 30 for determining a new $SOC_0$ and $SOC_1$.

In step 37, the state-of-charge may be output on a display device of the vehicle for identifying the state-of-charge to the operator. Alternatively, the state-of-charge may be provided to other vehicle systems for use in other vehicle operations where the battery state-of-charge is required for its operation.

FIG. 3 is a flowchart of Algorithm 1, as described earlier, for identifying whether $SOC_0$ and $SOC_1$ is found. In step 40, the routine is initiated and the flag is set to 0 (e.g., $Flag_{SOC0\_found}=0$). This flag identifies whether $SOC_0$ and $SOC_1$ are valid and therefore the flag is set to 1, or if invalid, the flag is set to 0.

In step 41, the ignition cycles are sequentially numbered for determining an estimated open circuit voltage $SOC_{OCV_{est}}$. For i=1 to N, the $SOC_{OCV_{est}}$ is determined by the following formula:

$$SOC_{OCV\_est}(k) = SOC_{OCV}(k-i) + \Delta SOC,$$

where
$SOC_{OCV}(k-i)$ is the OCV based SOC at ignition k−i,
$\Delta SOC$ is the integration of ignition-on current from ignition k−i to ignition k.

It should be understood that between the (k−1) and (k) ignition cycle, the engine may crank/start several times but if the ignition off time between two neighbor cranks is less than eight hours, then the OCV is unavailable.

In step 42, a determination is made as to whether difference between the $SOC_{OCV}$ at the $k^{th}$ ignition and the $SOC_{OCV_{est}}$ is less than a predefined error bound. The formula for the above determination is represented as follows:

$$|SOC_{OCV}(k) - SOC_{OCV\_est}(k)| < \epsilon,$$

where $\epsilon$ is the predefined error bound. The following parameters utilized for determining the above inequality is as follows:

$Flag_{SOC0\_found} = 1$
$SOC_0 = SOC_{OCV}(k-i)$
$SOC_1 = SOC_{OCV}(k)$ where $SOC_{OCV}(k)$ is the SOC at the $k^{th}$ ignition start, and $SOC_{OCV}(k-i)$ is the SOC at a prior ignition start.

If the determination in step 42 is that the difference is less than the predetermined error bound $\epsilon$, then the routine proceed to step 43, otherwise the routine returns to step 41 for re-estimating an open circuit voltage state-of-charge.

In step 43, the subroutine exits and the SOC values for obtained for $SOC_{OCV}$ and $SOC_{OCV_{est}}$ are used for determining for determining the ignition-off current $I_{off}$.

The following embodiments describe various embodiments for determining the ignition-off current $I_{off}$. If error or noise is not present in any of the measurement data, then a straightforward model may be utilized. The following formula may be used if the error and bias is not present for determining the ignition off current:

$$I_{off}(k) = \left[SOC(k) - SOC(k-1) - \frac{1}{C_{norm}}\int \rho \cdot I_{on}(k-1,t) \cdot dt\right] \cdot C_{norm}/\Delta t_{off}(k-1)$$

where SOC(k) is the state-of-charge at the $k^{th}$ ignition start, SOC(k−1) is the state-of-charge at the k−1 ignition start, $C_{norm}$ is the battery, $\rho$ is the charge efficiency, and $\Delta t_{off}$ is the time.

Alternatively, if any error is present in the measurement data, then the following embodiments may be used to for determining $I_{off}$. The following model represents a particle filter that may be used if the noise/error is not Gaussian (i.e., normal distribution). The model follows a state space model and the equations that represent the state space model are follows:

$$\begin{cases} SOC_{(est)}(k) = SOC_{est}(k-1) + \frac{1}{C_{norm}}\int \rho \cdot I_{on} \cdot dt + \frac{1}{C_{norm}} I_{off} \cdot \Delta t_{off} + \varepsilon_{SOC} \\ I_{off}(k) = I_{off}(k-1) + \varepsilon_1 \end{cases}$$

the measurement model is represented as follows:

$$SOC_{est}(k) = SOC_{OCV}(k) + \epsilon_{OCV}$$

where $SOC_{est}(k)$ is the ignition-off current for the current vehicle startup, and $SOC_{OCV}(k-1)$ is the ignition-off current for the previous vehicle startup, and $\epsilon_{OCV}$ is the current sensor error of the current sensor Once the state model and measurement model formulas are defined, the model is applied to determine the $I_{off}(k)$ using the following routine as shown in FIG. 5.

In step 50, the following particle set is initialized:

$$\{SOC_{est}^{i}, i=1,2,\ldots,N\}\{I_{off}^{i}, i=1,2,\ldots,N\}$$

In step 51, the particles are updated based on the state space model in the equation set forth above. Utilizing the state space model, $SOC_{est}^{i}(k)$ and $I_{off}^{i}(k)$ are determined from the particle set. $I_{on}$ is an ignition-on measurement, $SOC_{est}^{i}(k)$ is calculated utilizing the model.

In step 52, the weights used to compensate for the error/bias at each ignition start. The weights are calculated based on the difference between $\widehat{SOC}(k)$ and SOC(k). The larger the difference, the smaller the weight will be. is represented by the following formula:

$$w^i(k) = \frac{1}{\sigma\sqrt{2\pi}} e^{-\left[s\hat{o}c^i(k) - SOC(k)\right]^2/2\sigma^2}$$

where $\sigma$ is the standard deviation of the $\{SOC_{est}^{i}\}$.

In step 53, the particle set is resampled based on the weights. As the particles are resampled for a next iteration, there likelihood will be increased to obtain the particles closer to the true value of SOC(k). The estimation of SOC(k),k+1, k+2 will converge to the true value.

In step 54, an estimated weighted average ignition off current is determined using the following formula:

$$I_{off}(k) = \Sigma_i w^i(k) I_{off}^i(k)$$

$$SOC_{est}(k) = \Sigma_i w^i(k) SOC_{off}^i(k)$$

where $w^i(k)$ is the weights for each particle at each respective ignition start, and $I_{off}^i(k)$ is the measured ignition off current for each particle at each respective ignition start.

In the event that the noise/error is Gaussian which follows a normal distribution, then a Kalman filter may be used. The Kalman filter is utilizes a series of measurements that are observed over time. The measurements contain noise and other inaccuracies. The Kalman filter that operates recursively utilizing streams of noise input data to produce an estimate of the system. The Kalman filter produces estimates of unknown variables and are often more precise than estimates based on a single measurements.

While certain embodiments of the present invention have been described in detail, those familiar with the art to which this invention relates will recognize various alternative designs and embodiments for practicing the invention as defined by the following claims.

What is claimed is:

1. A method of determining a state-of-charge of a battery for a vehicle, the vehicle being in a charging state when the engine is operating and a non-charging state when the engine is not operating, the method comprising the steps of:
 (a) measuring an open circuit voltage (OCV) for a current vehicle ignition startup using a voltmeter, wherein the current vehicle ignition start-up is performed after the vehicle is in the non-charging state for at least eight hours;

(b) determining an open circuit voltage-based state of charge ($SOC_{OCV}$) for the current vehicle ignition startup using the processor;

(c) determining an estimated open circuit-based state of charge ($SOC_{OCV\_est}$) for a current vehicle ignition startup using the processor;

(d) determining whether the difference in the $SOC_{OCV}$ for the current vehicle ignition startup and the $SOC_{OCV_{est}}$ for the current vehicle ignition startup is less than a predefined error bound using the processor;

(e) performing steps (a)-(d) in response to the difference being greater than the predefined error; otherwise, proceeding to step (f);

(f) determining an ignition-off current for the current vehicle ignition startup as a function of the $SOC_{OCV}$ of the current vehicle ignition startup, an $SOC_{OCV}$ of a previous vehicle ignition startup, and a state-of-charge based on current integration over time using the processor technique;

(g) determining an estimated state of charge ($SOC_{est}$) of the current vehicle ignition startup using the processor; and (h) providing the $SOC_{est}$ to a vehicle subsystem for use in a vehicle operation where the battery state-of-charge is utilized.

2. The method of claim 1 wherein estimating a $SOC_{est}$ of the current vehicle ignition startup is determined as a function of the $SOC_{est}$ of a previous vehicle ignition startup, a state-of-charge based on an ignition-on current integration over time, and a state-of-charge based on the ignition-off current integration over time.

3. The method of claim 2 wherein estimating a $SOC_{est}$ of the current vehicle ignition startup is represented by the following formula:

$$SOC_{(est)}(k) = SOC_{est}(k-1) + \frac{1}{C_{norm}} \int \rho \cdot I_{on}(k-1) \cdot dt + \frac{1}{C_{norm}} I_{off}(k-1) \cdot \Delta t_{off}(k-1)$$

where $SOC_{est}(k-1)$ is the estimated state-of-charge at the k-1 ignition start, $C_{norm}$ is the battery capacity, $\rho$ is the charge efficiency, $I_{on}$ is the ignition on-current of the previous vehicle ignition start, $I_{off}$ is the ignition on-current of the previous vehicle ignition start, and $\Delta t$ is the time.

4. The method of claim 1 wherein the $SOC_{OCV\_est}$ for a current vehicle ignition startup is determined by the following formula:

$$SOC_{OCV\_est}(k) = SOC_{OCV}(k-i) + \Delta SOC$$

where $SOC_{OCV}(k-i)$ is and open circuit voltage based SOC at ignition k-i, and $\Delta SOC$ is the integration of ignition-on current from ignition k-i to ignition k, and i is a count of the vehicle ignition startup.

5. The method of claim 1 wherein if no error is present in the measurement data, then the formula for determining the vehicle ignition-off current is determined as follows:

$$I_{off}(k) = \left[ SOC(k) - SOC(k-1) - \frac{1}{C_{norm}} \int \rho \cdot I_{on}(k-1,t) \cdot dt \right] \cdot C_{norm} / \Delta t_{off}(k-1)$$

where $SOC(k)$ is the state-of-charge at the $k^{th}$ ignition start, $SOC(k-1)$ is the state-of-charge at the k-1 ignition start, $I_{on}$ is the ignition-on current, $I_{off}$ is the ignition-off current, $\rho$ is the charge efficiency, and t is the time.

6. The method of claim 1 wherein if measurement data error is present and an error distribution is non-uniform, then a particle filter is used for determining the ignition-off current.

7. The method of claim 6 wherein a state space model is defined and a measurement model is defined for determining the ignition-off current.

8. The method of claim 7 wherein the state space model of the SOC for current vehicle ignition startup is defined by the following formula:

$$SOC(k) = SOC(k-1) + \frac{1}{C_{norm}} \int \rho \cdot I_{on} \cdot dt + \frac{1}{C_{norm}} I_{off} \cdot \Delta t_{off} + \varepsilon_{SOC}$$

where $SOC(k)$ is the state-of-charge at the $k^{th}$ ignition start, $SOC(k-1)$ is the state-of-charge at the k-1 ignition start, $C_{norm}$ is the battery, $I_{on}$ is the ignition-on current, $I_{off}$ is the ignition-off current, $\rho$ is the charge efficiency, $\Delta t$ is the time, and $\varepsilon_{SOC}$ is an error the measurement data of a current sensor in the SOC determination.

9. The method of claim 8 wherein the state space model of the ignition-off current for the vehicle ignition startup is defined by the following formula:

$$I_{off}(k) = I_{off}(k-1) + \epsilon_1$$

where $I_{off}(k)$ is the ignition-off current for the current vehicle startup, and $I_{off}(k-1)$ is the ignition-off current for the previous vehicle startup, and $\epsilon^1$ is the measurement error of a current sensor.

10. The method of claim 7 wherein the measurement model is defined by the following formula:

$$SOC_{off}(k) = SOC_{OCV}(k) - \epsilon_{OCV}$$

where $SOC_{off}(k)$ is the ignition-off current for the current vehicle startup, and $SOC_{OCV}(k-1)$ is the ignition-off current for the previous vehicle startup, and $\epsilon_{OCV}$ is the measurement error of the current sensor for the OCV.

11. The method of claim 7 wherein determining the ignition-off current using the particle filter comprises the following steps of:
   initializing a particle set;
   updating a respective particle in the particle set based on the state space model for determining a estimate of the $SOC_{est}$ at a $k^{th}$ ignition start using the state space model;
   calculate a weighting factor that is a function of the SOC at a $k^{th}$ ignition start and the estimate $SOC_{est}$ at a $k^{th}$ ignition start;
   resampling a particle set as a function of the weighting factor; and
   estimating the weighted average of the ignition-off current at current ignition startup.

12. The method of claim 11 wherein the particle set of $I_{off}^i(0)$ for i=1, 2, . . . , N.

13. The method of claim 12 wherein the weighting factor is represented by the following formula:

$$w^i(k) = \frac{1}{\sigma\sqrt{2\pi}} e^{-\left[ SO\hat{C}^i(k) - SOC(k) \right]^2 / 2\sigma^2}$$

where $\sigma$ is the standard deviation of the $SOC_{est}$.

14. The method of claim 13 wherein the estimated weighted average of the ignition-off current is represented by the following formula:

$$I_{off}(k) = \Sigma_i w^i(k) I_{off}^i(k)$$

where $w^i(k)$ is a respective weight for a particle at each respective ignition start, and $I_{off}^i(k)$ is the measured ignition off current for each particle at each respective ignition start.

15. The method of claim 1 wherein if current sensor error is determined and an error distribution is uniform, then a Kalman filter is used for determining the ignition-off current.

16. The method of claim 1 wherein the step of providing the $SOC_{est}$ to a vehicle subsystem for use in a vehicle operation includes outputting the $SOC_{est}$ to a display device for identifying the state-of-charge to the operator of the vehicle.

17. The method of claim 1 further comprising the step of determining whether the estimated SOC is utilized for a duration of time greater than a predetermined period of time, and wherein a return is made to step (a) if the estimated SOC being utilized for a duration of time that is greater than the predetermined period of time.

18. The method of claim 17 wherein if the estimated SOC is utilized for a duration of time that is less than a predetermined period of time, the method comprises the following steps:
- determining whether the current ignition-off time is greater than eight hours and the $SOC_{OCV}$ is within an error bound; and
- proceeding to step (f) in response to determining that the current ignition-off time is greater than eight hours and the $SOC_{OCV}$ is within the error bound, otherwise proceeding to step (a).

* * * * *